United States Patent [19]
Dorney

[11] Patent Number: 5,920,573
[45] Date of Patent: Jul. 6, 1999

[54] METHOD AND APPARATUS FOR REDUCING AREA AND PIN COUNT REQUIRED IN DESIGN FOR TEST OF WIDE DATA PATH MEMORIES

[75] Inventor: Timothy D. Dorney, Houston, Tex.

[73] Assignee: Texas Istruments Incorporated, Dallas, Tex.

[21] Appl. No.: 08/681,190

[22] Filed: Jul. 22, 1996

Related U.S. Application Data

[XX .
[60] Provisional application No. 60/020,369, Jun. 25, 1996.

[51] Int. Cl.[6] .................................................. G11C 29/00
[52] U.S. Cl. ...................... 371/21.2; 371/67.1; 365/201
[58] Field of Search ............................ 371/21.2, 67.1; 365/201, 189.07, 189.02, 220, 230.02

[56] References Cited

U.S. PATENT DOCUMENTS

| | | | |
|---|---|---|---|
| 4,541,090 | 9/1985 | Shiragasawa | 371/21.1 |
| 4,744,061 | 5/1988 | Takemae et al. | 365/201 |
| 4,868,823 | 9/1989 | White, Jr. et al. | 371/21.3 |
| 5,075,892 | 12/1991 | Choy | 382/61 |
| 5,185,744 | 2/1993 | Arimoto et al. | 371/21.2 |
| 5,301,155 | 4/1994 | Wada et al. | 365/201 |

*Primary Examiner*—Hoa T. Nguyen
*Attorney, Agent, or Firm*—Robby T. Holland; Carlton H. Hoel; Richard L. Donaldson

[57] ABSTRACT

A reduced silicon area, wide input/output (I/O) comparitor method and apparatus for design-for-test applications includes a plurality of input/output pins (60) and plural arrays of addressable storage cells (32–46). A page mode writing circuit provides, through a common data-in lead (30), plural copies of a test data bit, applied through one of the pins (30), for storage in addressed storage cells (32–46) along a row in each of the arrays of storage cells. A circuit receives an expected data bit (ED), and a readout circuit reads out the stored test data bit from the addressed storage cells along the row in each of the arrays of storage cells. A PRW signal generator (154) responds to a column address change to establish a first potential state on all four quadrant-specific common lines (102, 408, 411, and 413). A plurality of multiplexer circuits (230), each multiplexer circuit associated with two different arrays of storage cells, are arranged to combine the multiple data bits from the associated arrays (32–46) to a reduced number of outputs to the plural comparitors circuits (242, 244, 248, and 250).

33 Claims, 11 Drawing Sheets

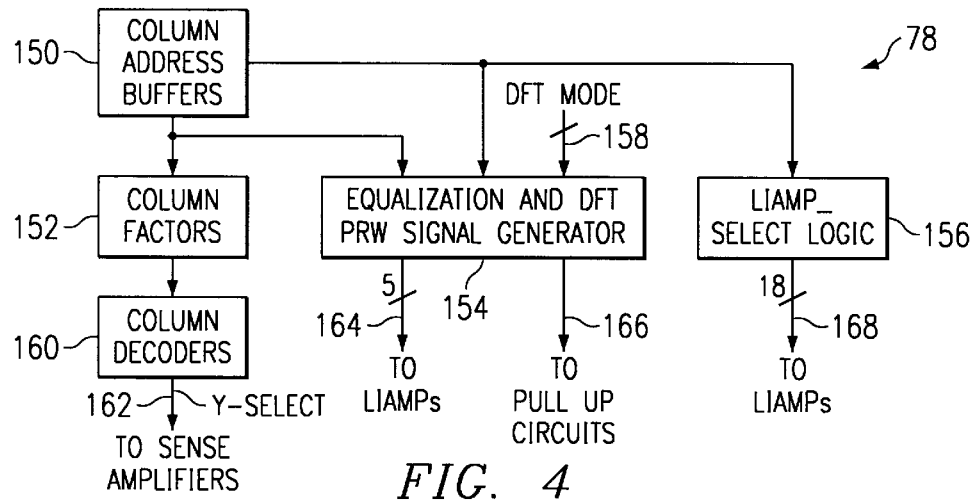
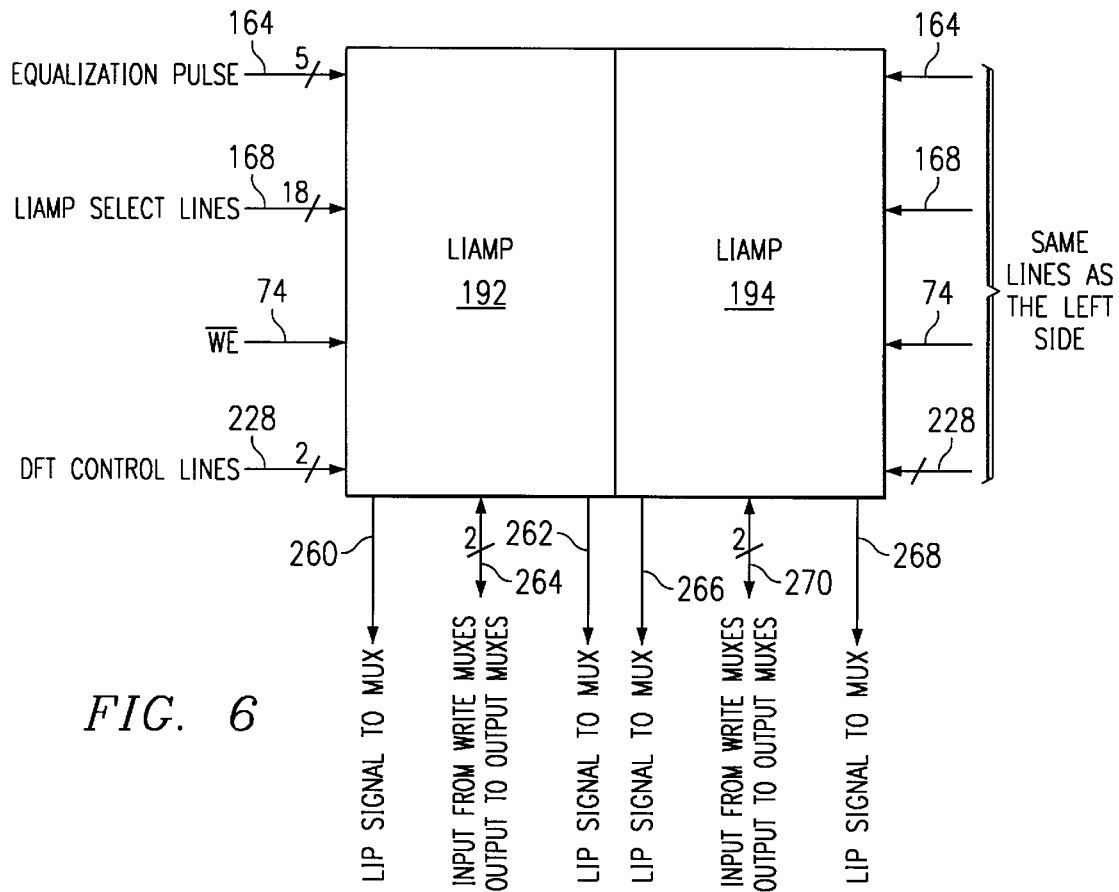

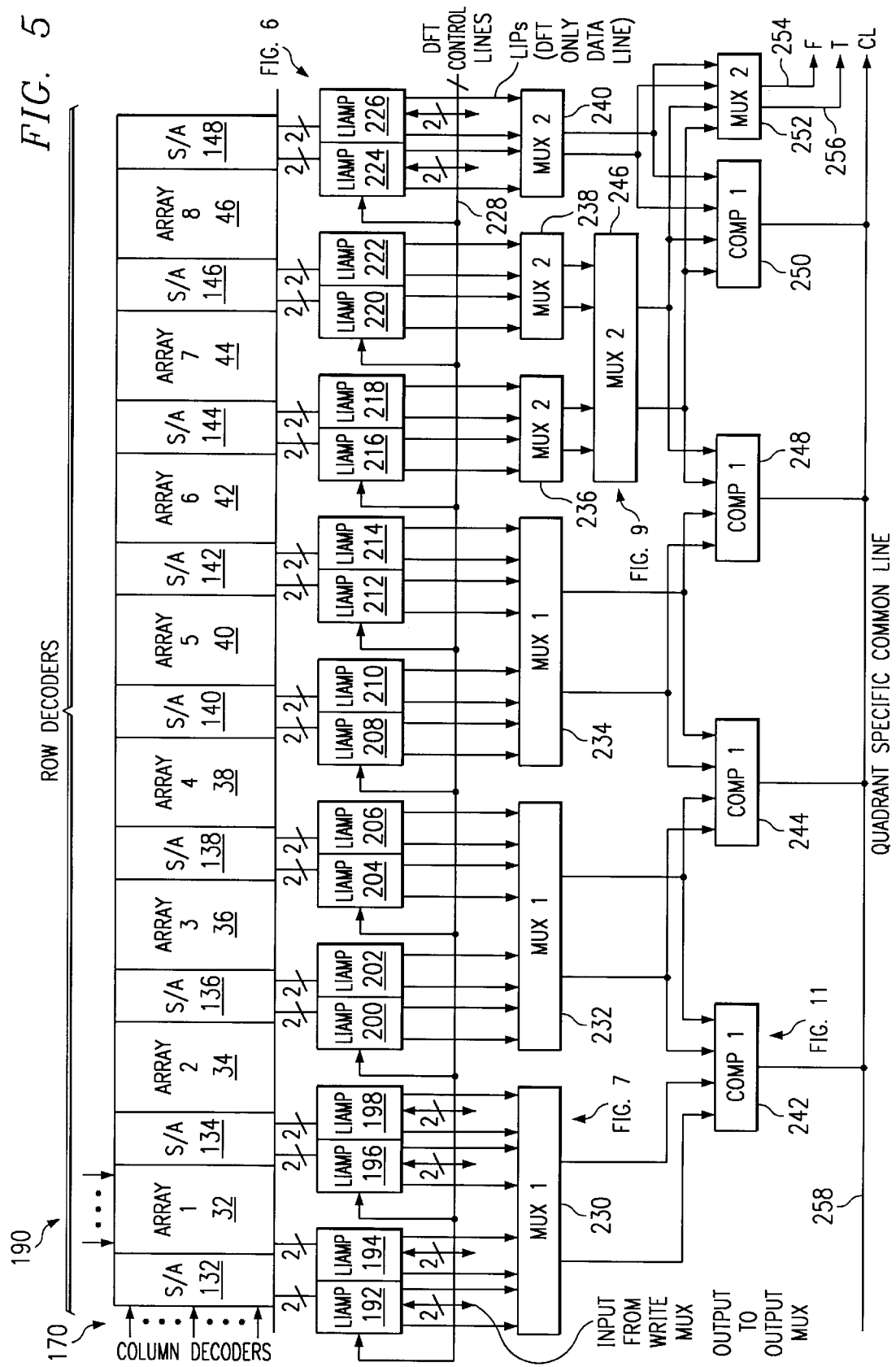

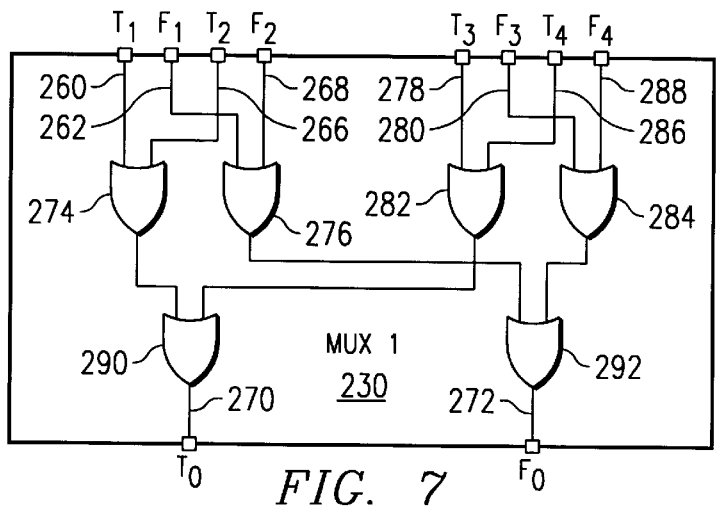
FIG. 7
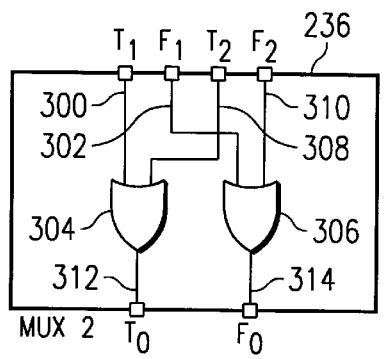
FIG. 9
FIG. 8
FIG. 10

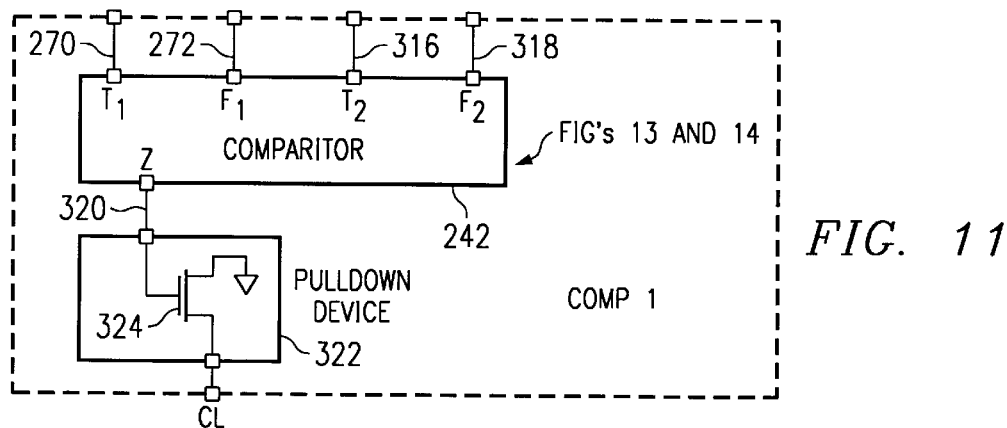
FIG. 11
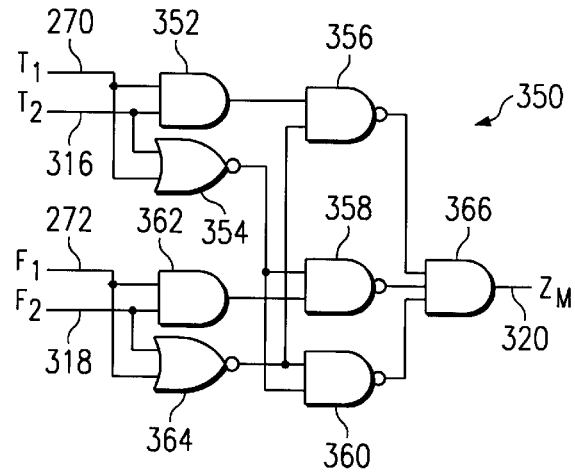
FIG. 12
FIG. 14
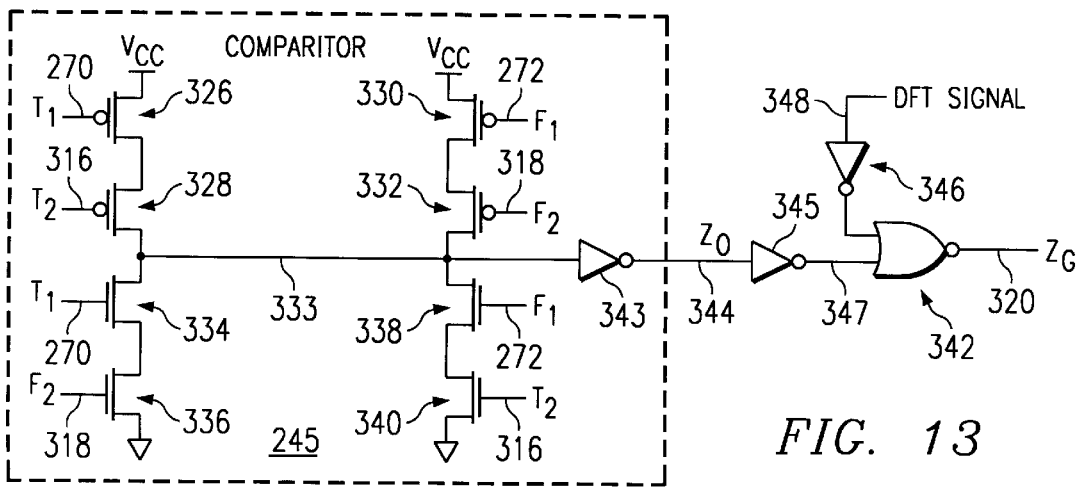
FIG. 13

| $Z_O$ | $T_1$ | $F_1$ | $T_2$ | $F_2$ | $Z_M$ | |
|---|---|---|---|---|---|---|
| 0 | 0 | 0 | 0 | 0 | 0 | |
| 0 | 0 | 0 | 0 | 1 | 1 | |
| 0 | 0 | 0 | 1 | 0 | 1 | |
| NA | 0 | 0 | 1 | 1 | 1 | |
| 0 | 0 | 1 | 0 | 0 | 1 | |
| 0 | 0 | 1 | 0 | 1 | 0 | ⟩A |
| 1 | 0 | 1 | 1 | 0 | 1 | |
| 1 | 0 | 1 | 1 | 1 | 1 | |
| 0 | 1 | 0 | 0 | 0 | 1 | |
| 1 | 1 | 0 | 0 | 1 | 1 | |
| 0 | 1 | 0 | 1 | 0 | 0 | ⟩B |
| 1 | 1 | 0 | 1 | 1 | 1 | |
| NA | 1 | 1 | 0 | 0 | 1 | |
| 1 | 1 | 1 | 0 | 1 | 1 | |
| 1 | 1 | 1 | 1 | 0 | 1 | |
| 1 | 1 | 1 | 1 | 1 | 1 | |
FIG. 15
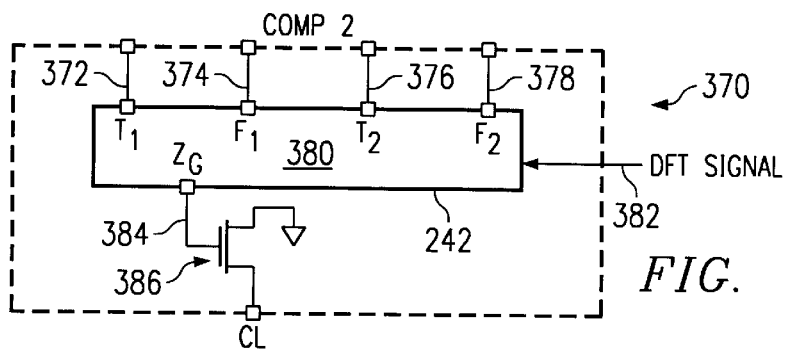
FIG. 16
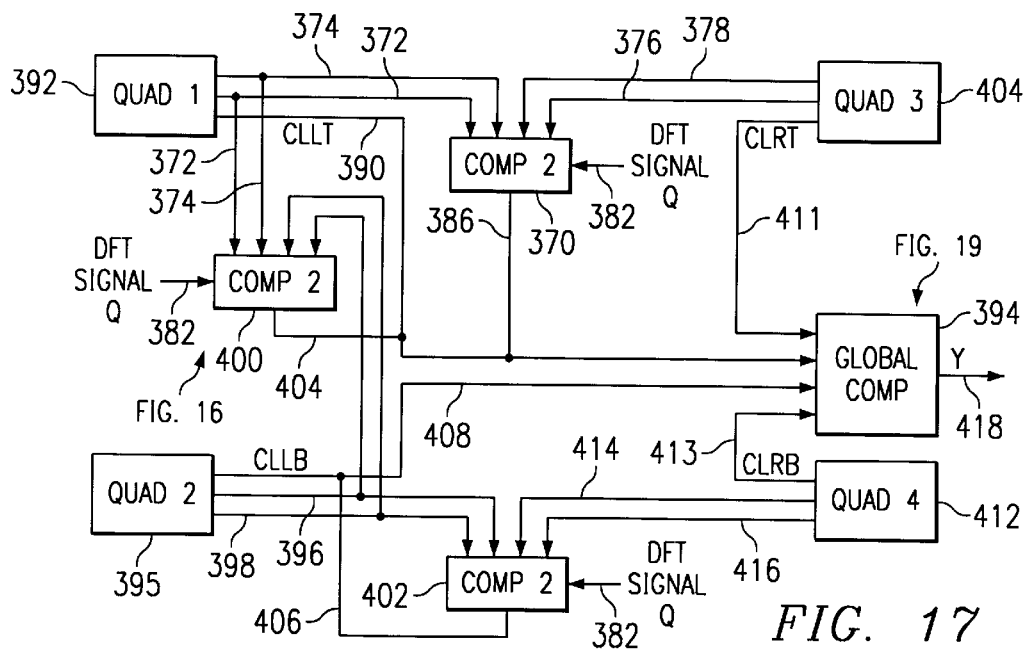
FIG. 17

| Y | CLRT | CLLT | CLLB | CLRB |
|---|------|------|------|------|
| 0 | 0 | 0 | 0 | 0 |
| 0 | 0 | 0 | 0 | 1 |
| 0 | 0 | 0 | 1 | 0 |
| 0 | 0 | 0 | 1 | 1 |
| 0 | 0 | 1 | 0 | 0 |
| 0 | 0 | 1 | 0 | 1 |
| 0 | 0 | 1 | 1 | 0 |
| 0 | 0 | 1 | 1 | 1 |
| 0 | 1 | 0 | 0 | 0 |
| 0 | 1 | 0 | 0 | 1 |
| 0 | 1 | 0 | 1 | 0 |
| 0 | 1 | 0 | 1 | 1 |
| 0 | 1 | 1 | 0 | 0 |
| 0 | 1 | 1 | 0 | 1 |
| 0 | 1 | 1 | 1 | 0 |
| 1 | 1 | 1 | 1 | 1 |
*FIG. 18*
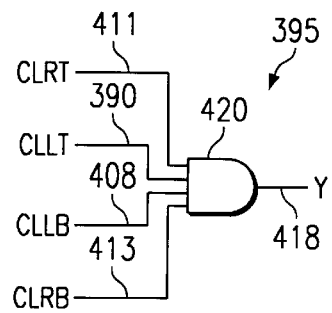
*FIG. 19*
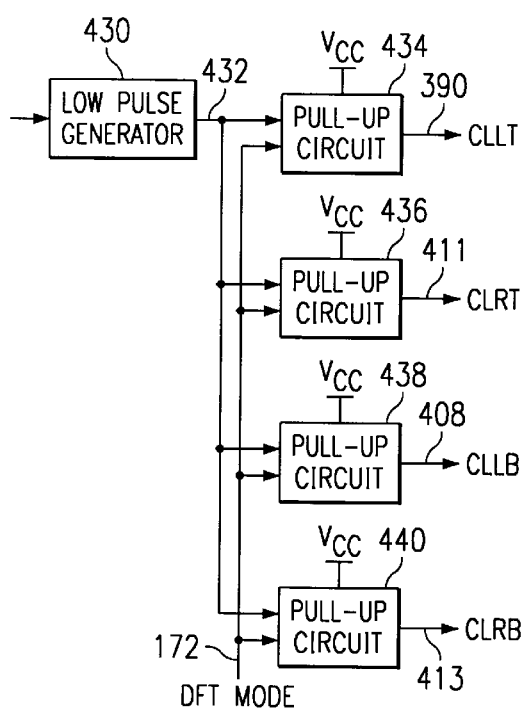
*FIG. 20*
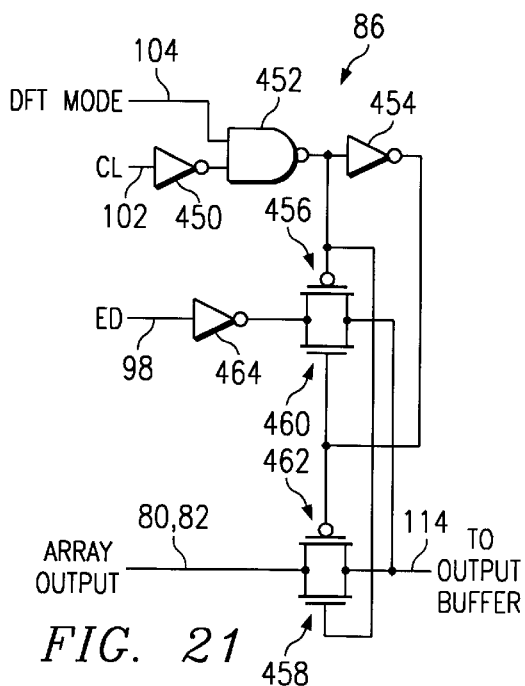
*FIG. 21*
| OUT | DFT MODE | ARRAY OUTPUT | ED | CL |
|-----|----------|--------------|----|----|
| 0 | 1 | 0 | X | 1 |
| 1 | 1 | 1 | X | 1 |
| 1 | 1 | X | 0 | 0 |
| 0 | 1 | X | 1 | 0 |
| 0 | 0 | 0 | X | X |
| 1 | 0 | 1 | X | X |
*FIG. 22*

METHOD AND APPARATUS FOR REDUCING AREA AND PIN COUNT REQUIRED IN DESIGN FOR TEST OF WIDE DATA PATH MEMORIES

RELATED APPLICATION

This application claims priority under 35 USC §119(e)(1) to provisional application Ser. No. 60/020,369, filed Jun. 25, 1996.

TECHNICAL FIELD OF THE INVENTION

This invention relates to an integrated circuit memory device and more particularly to a reduced silicon area, wide input/output (I/O) comparitor method and apparatus for design-for-test (DFT) applications

BACKGROUND OF THE INVENTION

Integrated circuit memory devices store information in arrays of cells arranged in addressable rows and columns. During fabrication of these devices, one or more defects may occur and prevent the proper performance of the memory circuit. Some types of defects may be analyzed and corrected on the device. Other types of defects may not be corrected and are the cause of the failed devices. Distribution of defects in any memory device may be random. The yield of good devices per wafer can be improved over time by eliminating the causes of such defects.

Integrated circuit memories are being made with increasing bit densities, smaller storage cell sizes, and more input/output (I/O) pins, as the generations of new memory devices are designed and built. As a result, devices are more susceptible to defects caused by processing variations and reduced tolerances. Testing must be done to detect and correct the defects so that sufficiently high device yields are achieved for profitable production.

Problems arise in testing integrated circuit devices with greater densities and with more input/output pins.

Memory devices which have more storage cells require longer task sequences to be run. Therefore, more device tester time is required for testing each device. Also, end users desire to use more and more I/O pins per device. Such wide I/O pin devices inherently limit the number of such devices which can be tested at one time on a device tester. Thus, fewer of the wide I/O devices can be tested simultaneously on one device tester. Both the increase in test time and the reduced number of devices that can be tested at one time make testing an ever-increasing expense.

In response to the dilemma which has developed, the Electronics Industries Association's Joint Electron Device Engineering Council (JEDEC) has undertaken a project to establish a parallel write, parallel read design-for-test (DFT) interface specification for memory devices. The test interface specification includes a single input data pin providing the data to all input circuits of the test device. During a test write operation, a single data bit, received on the single input data pin, is written concurrently into all arrays of the memory device.

Subsequently, to perform the test read operation, the stored data bit is simultaneously read out of the several arrays of the memory device. The data bit read from each array is compared with an expected data bit. If all of the data bits read out of the arrays agree with the expected data bit, the state of the expected data bit is transmitted off of the memory device by way of single output pin to the tester. If one or more of the data bits read out disagree with the expected data bit, the expected data bit is inverted and transmitted out the single output pin to the tester.

Current DFT methodologies for testing narrow I/O data pin memory devices use multiple signal lines traversing the chip. Such multiple signal lines occupy valuable device area. As the number of I/O data pins increases, the number of signal lines increases proportionately. Presently, therefore, there is not an effective way to design an integrated circuit memory device that incorporate the JEDEC interface specification for testing simultaneously several wide I/O pin memory devices on a single device tester without using unnecessary device area.

In most dense designs, on-chip routing from one group of logic to another consumes 60 percent of the silicon area in row organized architectures. Traditional DFT circuitry for a wide I/O comparison only aggravates the solution through the use of multiple routing lines. Also, several new DFT tests such as x4 laser repair and x64 parallel read/write have placed constraints on the DFT architecture. A method which provides the required DFT comparisons while maintaining speed and reducing the routing area is needed.

SUMMARY OF THE INVENTION

In light of the above limitations, there is a need for a wide I/O memory device DFT design that minimizes the use of silicon area in the memory device.

There is also a need for a method and system to perform wide I/O memory device DFT operations that provides speeds comparable to those which multiple routing line approaches use.

There is a further need for a common line method for DFT operations that permit comparison results to occur at the same time, instead of sequentially, which known methods and systems employ.

Still, there is a need for a DFT method and system for wide I/O memory devices that permit multiple I/O widths to be tested using a single comparison circuit.

These and other problems are solved by a reduced silicon area, wide input/output (I/O) comparitor method and apparatus for design-for-test applications of the present invention.

According to one aspect of the present invention, there is provided a reduced silicon area, wide input/output (I/O) comparitor method and apparatus that includes a plurality of I/O pins, and a plurality of addressable storage cells. A writing circuit of the present invention provides, through a data-in lead, plural copies of a test data bit. The plural copies of a test data bit are applied through one of the pins for storage in an addressed storage cell in each of the arrays of the addressable storage cells. A circuit receives an expected data bit, and the read-out circuit reads out the stored test data bit from the addressed storage cell in each of the arrays of storage cells. A common line circuit responds to a column address change to establish a first potential state on each of four quadrant-specific common lines. Plural multiplexer circuits of the present invention associate with two different arrays of storage cells and are arranged to combine the multiple data bits from the associated arrays to a reduced number of outputs to a plural set of comparitors. The plural set of comparitor circuits associate with multiple multiplexers and are arranged to respond to the test data bits that are read out from storage in the associated arrays to change the potential state of the associated quadrant-specific common line when any comparison fails. A transmission circuit transmits the potential state of either the inverse of the expected data or the potential state of one of the addressed storage cells according to the potential state of all four of the quadrant-specific common lines.

The integrated circuit memory device of the present invention includes a plural number of comparitor circuits that is distributed around the memory device. Each comparitor circuit is located in close proximity to its associated multiplexers which are, themselves, in close proximity to their associated arrays of storage cells.

During a DFT write operation, the present invention uses only one input pin to write to all data inputs through the use of additional on-chip circuitry. This is extended in the DFT read operation by latching an Expected Data (ED) bit. If all internal outputs are the same as the ED bit, a single output pin registers a true comparison. If any outputs differ from the ED bit, a false comparison is recorded.

A technical advantage of the present invention is that it uses a single internal line for write operations and a single internal line per quadrant for read operations. The write operation uses a data-in line to write to each of the inputs. The data on the one, global data-in line is substituted for the data normally latched at each of the separate input pins.

Another technical advantage of the present invention is that its read operation uses only four quadrant-specific common lines. At the beginning of a DFT read cycle, the four lines are precharged to a high state. As data is read from the arrays, a local comparator determines if the data from adjacent arrays has the same data. The local comparitors near the local I/O amplifiers discharge the quadrant-specific common line if a failure occurs. The local comparitors are arranged to be used a variety of test including x16 and x64 comparisons. The only lines required to route to a global comparitor are the four quadrant-specific common lines. This architecture also allows the x4 laser repair test to be implemented.

Most other memory devices have the DFT parallel read/write mode use multiple internal lines (one for each I/O) to route to a comparitor circuit. Another technical advantage of the present invention is that the proposed solution distributes the comparison to each output. Only four common lines are used to connect all comparitors. The result is a faster solution than that of the known daisy chain techniques since one comparison does not have to wait until a previous comparison completes.

Another technical advantage of the present invention is that known common line designs have used a static pull-up transistor that must be overcome to bring the common line to a low voltage. The present invention uses a dynamic pull-up transistor to charge the line, and then lets the line float. The inherent resistance and capacitance of the long common line creates a tendency to maintain a high voltage once charged. The common line will not be able to be pulled low until a failed comparison occurs. This is faster than known methods and systems, since no static pull-up devices are employed.

Another technical advantage of the present invention is that its comparitor circuitry is designed to handle x16, x32, and x64 parallel read/write operations. A single quadrant specific line is required per quadrant irrespective of the width of the I/O test (x16, x32, and x64). The present invention also allows the quadrant-specific common lines to be used for the x4 laser repair operation.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein:

FIG. 3, present a block diagram of an arrangement for testing an integrated circuit memory device that has several I/O pins, and it includes an design-for-test according to the present invention;

FIG. 4 shows the column decode circuit of the illustrative embodiment;

FIG. 5 illustrates one quadrant for the integrated circuit memory device of FIGS. 1 through 3;

FIG. 6 shows one embodiment of the local I/O amplifier (LIAMP) circuit of the present embodiment;

FIG. 7 presents a circuit for implementing a first multiplexer of the present invention;

FIG. 8 provides a truth table corresponding to the circuitry of FIG. 7 to more completely explain the operation of the present embodiment;

FIG. 9 depicts circuit logic for performing a second multiplexer of the present invention;

FIG. 10 provides a truth table corresponding to the operation of the circuitry of FIG. 9;

FIG. 11 shows the comparitor and pull-down device block-diagram of a first comparitor component of the present invention;

FIG. 12 illustrates a truth table for the comparitor of FIG. 11, and has additional column to represent the comparitor circuit for FIG. 16;

FIG. 13 represents one embodiment of the comparitor circuit of FIG. 11, and has additional logic to act as the comparitor circuit for FIG. 16;

FIG. 14 shows an alternative embodiment of the comparitor circuit of FIG. 11;

FIG. 15 presents a truth table for comparing the operation of the comparitor circuit of FIG. 13 to that of alternative comparitor circuit of FIG. 14;

FIG. 16 provides a second comparitor circuit of the present invention;

FIG. 17 illustrates the use of the plural ones of the comparitor circuit of FIG. 11, the use of three of the second comparitors of FIG. 16, together with the global comparitor circuit to yield a common output for the memory device of the present invention;

FIG. 18 gives one logic circuit for performing the truth table function of the global comparitor of FIG. 17;

FIG. 19 is a truth table formed according to the global comparitor circuit of FIG. 18;

FIG. 20 shows a pulse generator circuit for the comparitor circuit of FIG. 17;

FIG. 21 provides a circuit logic diagram for generating an output buffer signal according to the present invention;

FIG. 22 illustrates a truth table for the output buffer multiplexer of FIG. 21.

DETAILED DESCRIPTION OF THE INVENTION

Preferred embodiments of the present invention are illustrated in the FIGUREs wherein like numerals refer to like and corresponding parts of the various drawings.

Figure 1:
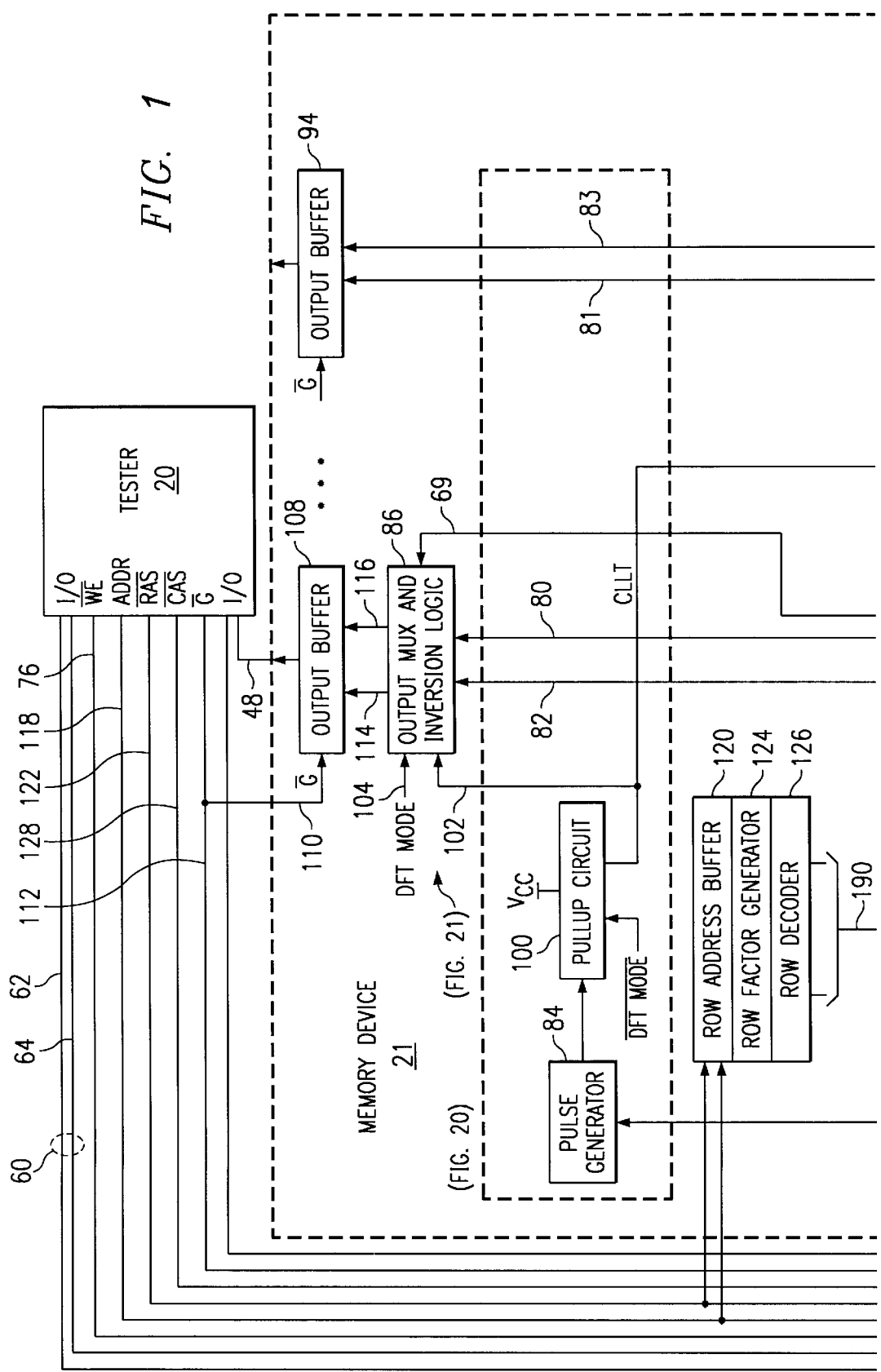
FIGS. 1 and 2, when arranged as shown
Figure 2:
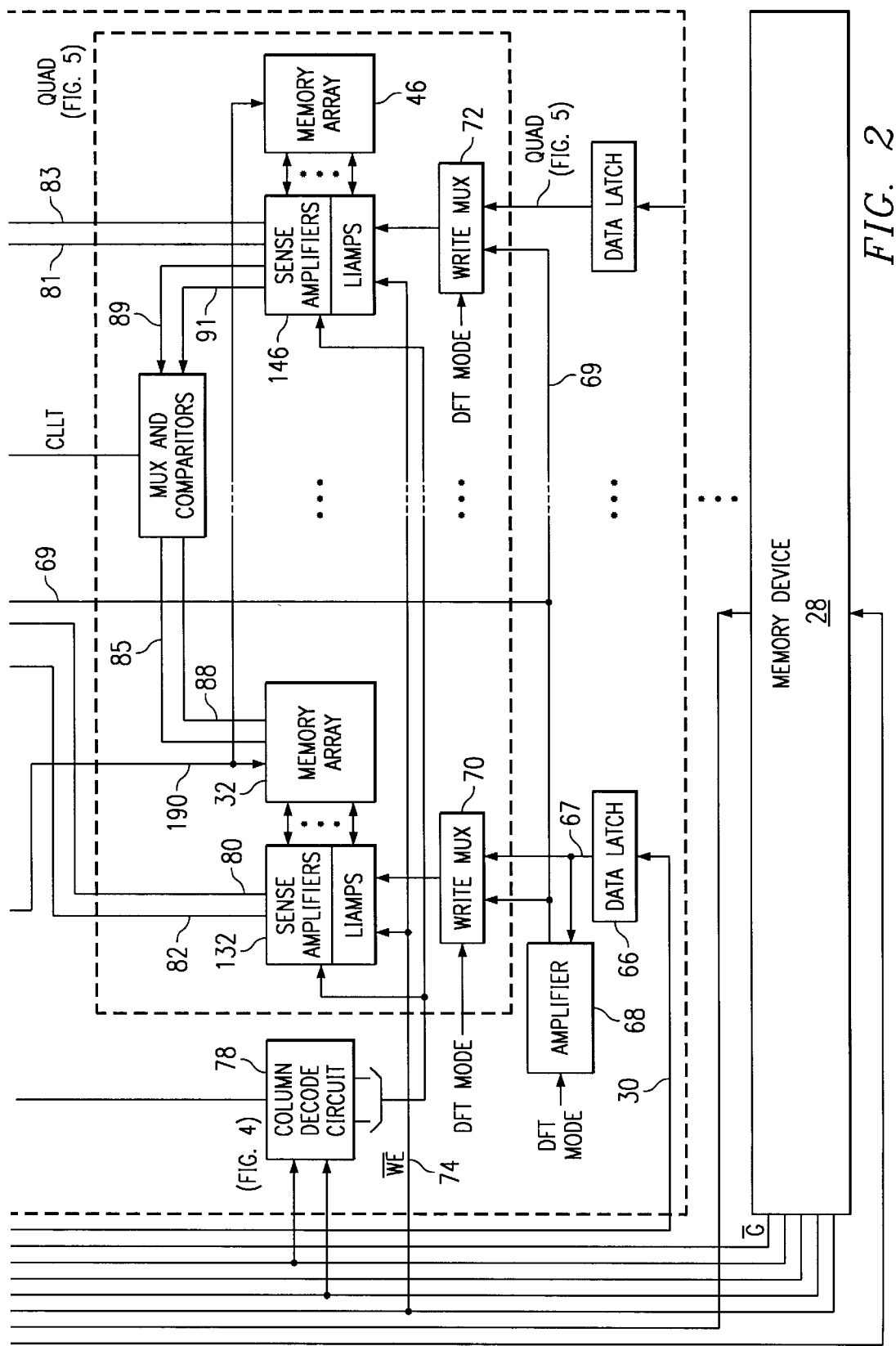

Referring now to FIGS. 1, 2, and 3, there is shown a block diagram of tester 20 that interconnects with the set of memory devices including the memory devices 21 through 28. Only memory devices 21 and 28 are shown. The others are represented by the vertical ellipses located between memory devices 21 and 28. Each of memory devices 21 through 28 is an integrated circuit, such as memory device 21, that is designed for test. Memory device 21 includes four quadrants of memory arrays 32 through 46 of information storage cells. For example, there may be eight memory arrays 32, 34, 36, 38, 40, 42, 44, and 46 in each quadrant. Only two of memory arrays 32 and 46 are actually shown. The other six memory arrays are represented by an ellipsis located between memory arrays 32 and 46. All of memory arrays 32 through 46 are arranged to be accessible for writing data into an addressed one of the storage cells of each array. An additional three quadrants of like arrangement also exist but are not shown.

Common control signals and address signals are supplied by tester 20 to each of memory devices 21 through 28. In some application-specific memory devices (not shown), additional control signals may be used. Additionally, I/O signals are coupled between the tester 20 and the memory devices 21 through 28. A separate pair of input and output leads is connected between tester 20 in each of the memory devices 21 through 28. One lead of each of the pairs of leads (e.g., input data lead 30) supplies a test data signal to the associated memory device (e.g., memory device 21). A second one of the leads of the pair of leads (e.g., output lead 48) transmits results from a test of a memory device (e.g., memory device 21) to tester 20. Tester 20 also includes I/O lines 60 that include input line 62 going to memory device 28 and output line 64 connecting to memory device 28. Although not shown, other I/O lines connect between tester 20 and memory devices 22 through 27.

When memory devices 21 through 28 are being tested, they are all tested concurrently. The test data signal, generated by tester 20, is sent over all of the input data leads to the respective memory devices 21 through 28. Each of the memory devices 21 through 28 stores the test data signal in an addressed storage cell located in each of the arrays. Since only the memory device 21 is shown in detail, the subsequent description can be directed not only to memory device 21, but to similarly other memory devices.

In FIGS. 1 and 2, Memory device 21 receives input at data latch 66 from input line 30. Data latch 66 provides output via line 67 to amplifier 68 and write multiplexer or mux 70. Amplifier 68 receives a DFT mode input as does write mux 70.

The amplifier 68 provides output via line 69 to write mux 70 as well as each of the write multiplexers that associate with sense amplifiers 132 through 146. Output from write multiplexer 70 line goes to sense amplifier 132 as does write enable ($\overline{WE}$) signal 74 from write enable line 76 leading from tester 20. ($\overline{WE}$) line 74 provides common write enable signals to all sense amplifiers 132 through 146. Sense amplifiers 132 through 146 also receive column decode input from column decode circuit 78. Sense amplifier 132 communicates with memory array 32 as does each of the sense amplifiers 134 (not shown) through 146 communicate with an associated memory array 34 through 46. In practice, each set of sense amplifiers 132 through 146 includes yet a further sense amplifier 148 that is described more fully in connection with FIG. 5 below.

Output from sense amplifier 132 appears on lines 80 and 82 that go to output mux and inversion logic 86. Output from sense amplifier 146, via lines 81 and 83, goes to output buffer 94. In addition, sense amplifier 132 and its associated local input/output amplifier (LIAMP) has special local output parallel (LIP) signals 85 and 87 that go to the mux and comparitor circuits. Similarly, sense amplifier 146 and its associated LIAMP have LIP signals 89 and 91 which also go to the mux and comparitor circuits. The sense amplifier not shown have a similar arrangement. The mux and comparitor circuits are explained in greater detail below.

Output mux and inversion logic 86 receives signals from amplifier 68 via line 69, as well as output from pull-up circuit 434 via line 102, also shown as common line left top (CLLT), and DFT mode input 104. Pulse generator 430 generates a pulse signal to pull-up circuit 434. Output buffer 108 receives $\overline{G}$ input 110 from $\overline{G}$ common line 112 as well as outputs 114 and 116 from output mux and inversion logic 86. Output buffer 108 generates output along line 48 to tester 20. Similarly, output buffer 94 receives input signals 81 and 83 from sense amplifier 146 to produce an output dependent on the potential state of $\overline{G}$. Unlike the previously described arrangement, output buffer 94 is neither associated with an output mux and inversion logic nor is its output connected to tester 20. This occurs since only a limited number of pins are used to output data to tester 20 while in a parallel design for test operation. Other lines associated with tester 20 include address line 118 that provides address information to row address buffer 120 as does row address strobe signal $\overline{RAS}$ line 122.

Row address buffer circuit 120, row factor generator circuit 124, and row decoder 126 all form part of row decode circuit that provides input to memory arrays 32 through 46. $\overline{CAS}$ line 128 latches column addresses into column decode circuit 78, as does address line 118. Column decode circuit 78 provides column decode input to sense amplifiers 132 through 146.

When the memory devices 21–28 are being tested, they are all tested concurrently. The test data signal, generated by the tester 20, is sent over all of the input data leads to the respective memory devices 21–28. Each of the memory devices 21–28 stores the test data signal in an addressed storage cell located in each of the arrays. Since only the memory device 21 is shown in detail, the subsequent description will be directed to the memory device 21, but the other memory devices operate similarly at the same time.

In FIGS. 1 and 2, only the single input data lead 30 is connected between the tester 20 and the memory device 21, although there are additional input data pins and input data latches for each quadrant of memory device 21. Tester 20 has sixteen input/output connections, eight for input data and eight for output data. Therefore, tester 20 can be connected to the eight memory devices 21–28 for concurrent testing. The test data bit, generated and transmitted by the tester 20, is applied to and stored within the input data latch, of all eight memory devices 21–28 at once. Applying the test data bit to eight memory devices provides a substantial advantage over prior art arrangements which test only a single memory device having sixteen data input/output connections.

Memory device 21 is arranged specially for testing. For instance, the input data latch 66 has an output lead 67 connected to amplifier 68, which drives the test data bit from the input data latch 66 over a common data-in lead 69 and splitting in short parallel branches to all of the multiplexers 70. Other input data latches, do not have an amplifier analogous to the amplifier 68 because those other input data latches do not apply the test data bit to any multiplexer. The single common data-in lead 69 is used to connect an output of the data latch amplifier 68 to a test data input of each of the write multiplexers 70 and 72 in each quadrant of memory arrays. Write multiplexers that are not shown are represented by a series of dots located between the write multiplexers 70 and 72. All of the write multiplexers' test data inputs are located on the lefthand side of the multiplexers. Those inputs are selected by a design for test (DFT MODE) signal that is applied to each of the multiplexers. Advantageously, the common data-in lead 69 requires less device area than is required by any arrangement needing plural data-in leads routed across the device.

During testing, the same information is written to each I/O pin at any given time. This makes write operations to all the available I/O pins redundant. Using one pin to write (and one pin to read) to all I/Os is reasonable. Also, multiple devices can be tested simultaneously since the number of tester transceivers required per chip is reduced.

During a DFT write operation, one input pin writes to all data inputs through the use of additional on-chip circuitry. This is extended in the DFT read operation by latching an Expected Data (ED) bit. If all internal outputs are the same as ED, a single output pin registers a true comparison. If any outputs differ from ED, a false comparison is recorded.

With the present invention, the read operation uses only four quadrant specific common lines. At the beginning of a DFT read cycle, the four lines are precharged to a high state. As data is read from the arrays, a local comparitors determine if the data from adjacent arrays has the same data.

The local comparitors near the local I/O amplifiers (LIAMP) discharge the quadrant-specific common line if a failure occurs. The local comparitors are arranged to be used for a variety of tests including x16 and x64 comparisons. The only lines required to route to a global comparitor are the four quadrant specific common lines. This architecture also allows the x4 laser repair test to be implemented. These designs have been extended to include a local comparitor capable of handling a x16 and x64 DFT read operation, and four separate common lines to be used in the x4 laser repair test mode to determine the individual results of each quadrant on a separate output pin.

The present invention distributes comparisons by placing the comparitor circuits close to their associated sense amplifiers and LIAMP circuits which generate the output data from a read operation. The present invention also differs from the previous common line designs which have used a static pull-up transistor that must be overcome to bring the common line to a low voltage. The present invention uses a dynamic pull-up transistor to charge the line, then lets the line float. The inherent resistance and capacitance of the long common line creates a tendency to maintain a high voltage once charged. The common line will not be able to be pulled low until a failed comparison occurs.

The present invention is also faster since it employs no static pull-up devices. Also, the comparitor circuitry of the present invention handles both the x16 and x64 parallel read/write operations. Previous designs have used multiple routing lines for narrow I/O tests (x4 comparisons) and then used additional lines to multiplex the comparison for wide I/O tests (x16, x32, x64). Finally, quadrant-specific common lines allow for the x4 laser repair operation.

When the memory device 21 is not being tested and is operated as an ordinary memory device, data leads from a microprocessor are connected to each of the sixteen input data pins of the memory device 21. The sixteen input data, on those leads, is latched into each of the input latches 66. None of the other memory devices, shown in FIG. 2, is necessarily connected to the microprocessor. The DFT MODE signal is not enabled. Since different data is latched into separate data latches 66 and traverse separate circuit paths to the righthand inputs of the write multiplexers 70, different data can be transmitted through the multiplexers 70. Therefore, each of the write multiplexers 70 transmits data from its righthand input to its own output. This data then is stored in the addressed storage cells of memory arrays 32–46. Also, when memory device 21 is operating as an ordinary memory device, amplifier 70 is not enabled. The state of the lead 69 is held at ground when the memory device 21 is not being operated in the DFT mode, i.e., the signal DFT MODE is disabled. Likewise, the output mux and inversion logic 86 has no effect on data lines 80 and 82. Their potential state is received at output buffer 108 since the DFT mode is disabled.

Column decode circuit 78 is described in detail in FIG. 4. In FIG. 4, column decode circuit 78 includes column address buffers 150 that provide inputs to column factors circuit 152, equalization and DFT parallel read/write (PRW) signal generator 154, and LIAMP (local I/O amplifier) select logic 156. Output from column factors circuit 152 goes to column decoders circuit 160 to generate a Y-select signal to sense amplifiers 132 through 146. Equalization and DFT PRW generator circuit 154 generates output 164 to LIAMPS and 166 to low pulse generator 430. LIAMP select logic 156 provides multiple outputs 168 to determine which of the LIAMPs should output data to the data lines (e.g., data lines 80 and 82).

Column address buffers circuit 150 captures the column address when $\overline{\text{CAS}}$ falls from tester 20. Part of the column addresses are used to pick the Y-selects which control which sense amplifiers are connected to the LIAMPs. The part of the address which controls column decoders circuit, first goes to column factors circuit 152 and then to column decoders circuit 160.

Column factors circuit 152 provides circuitry for breaking down column address information latched by the $\overline{\text{CAS}}$ input signal, into groups, where each group has multiple lines associated with it. All of those lines are low except for one, based from the external address. An example would be an address of zero and one. While such an address has only two inputs, there are four possible combinations. Accordingly, this makes four factors, column factors CF0, CF1, CF2, and CF3, for example. One of those lines will be high based on the external address. All of the rest are low. Column decoder circuit 160, therefore, determines which Y-select should fire based on which factors are high. Column decoders circuit 160 drives the Y address column select signal output. This permits selecting which Y column is to be addressed in the memory by driving a Y-select signal that goes to sense amplifiers 132 through 146.

Equalization and DFT PRW signal generator circuit 154 supports the equalization mode of the LIAMPS (described in detail below), while LIAMP select logic 156 determines which one of four LIAMPs should output data. This is necessary since two arrays (e.g., arrays 32 and 34) are associated to the same output pin. As such, of the four LIAMPs that can control the data those lines only one LIAMP is connected at any given time.

In the present embodiment, there are 16 bits of data that can be read from the device (i.e. four bits per quadrant) at all times from the normal LIAMP outputs. The DFT control lines determine if the four bits of data from each quadrant should be output on the LIP lines, or if all possible data (i.e., 16 bits per quadrant) should be put on the LIP lines. The LIAMP select logic circuit 156 determines which LIAMPS to read, which provides at most four bits of data per quadrant.

Column decode circuit 78 also selects which LIAMPs are turned on. These addresses go through LIAMP circuit 156. In every read or write cycle, 16 of the 18 LIAMPs are connected to the sense amplifiers 132 through 146. In a normal read or write, only one LIAMP in every group of four transmits data from the sense amplifiers or takes data from the write multiplexers and puts it into the sense amplifiers.

In the x16 PRW DFT mode, four bits of data are read or written in each quadrant. During a read or write, again 16 of 18 LIAMPs are connected to the sense amplifiers. During the DFT read, only one LIAMP out of each group of four outputs data. Data is transmitted to both the output muxes through the normal pathway (e.g. lines 80 and 82) and through the LIP lines to the comparitors through the associated DFT first and second multiplexers. Both pathways use differential signals (one T (true) and one F (false)). During a DFT write, the same data is provided to all the write muxes and data is written the same way as in a normal write.

In the x64 PRW DFT mode, 16 bits of data is written in each quadrant. During a read or write, again 16 of 18 LIAMPs are connected to the sense amplifiers. During the DFT read, 4 of the LIAMPs (one from every group of four) output data to the output multiplexers, which is the normal pathway. Because the x64 DFT mode signal is high, all 16 of the 18 LIAMPs output differential data on the LIP lines to the comparitors. In a write cycle, only 4 LIAMPs take the same data from the write muxes and transmit it to the sense amplifiers. Therefore, 16 bits are written and 64 bits are read per quadrant. This requires four write cycles to provide data for a single x64 DFT read operation. During equalization, the DFT information lines (LIPS) are low, which go through the muxes to the comparitor circuits to turn the comparitors circuits off to prevent sending a signal from a comparator that is not reading data.

FIG. 5 shows one quadrant of memory arrays formed according to the teachings of the present embodiment. In FIG. 5, column decoders output 170 goes to sense amplifiers 132 through 148 and memory arrays 32 through 46. Row decoders input 190 provides X-select input signals to memory arrays 32 through 46. Output from sense amplifiers 132 through 148 and memory arrays 32 through 46 go to LIAMPS 192 through 226 with each LIAMP 192 through 226, respectively, associated with one or more memory arrays 32 through 46. DFT control lines 228 provide inputs to respective pairs of LIAMPS 192 through 226 to determine if a x16 DFT, x64 DFT, or no DFT operation should occur. Each LIAMP communicates with a respective MUX 1 230 through 234 or MUX 2 236 through 240. MUX 1 230 and MUX 1 232 provide input to COMP 1 242. MUX 1 232 and MUX 1 234 provide inputs to COMP 1 244. MUX 2 236 and MUX 2 238 provide inputs to MUX 2 246, the output of which goes along with the output from MUX 1 234 to COMP 1 248. COMP 1 250 receives input from MUX 2 246 and MUX 2 240. MUX 2 252 receives input from MUX 2 246 and MUX 2 240 to generate F output 254 or T output 256, as appropriate. Quadrant-specific common line 102 receives and transmits the input from COMP 1 242, COMP 1 244, COMP 1 248, and COMP 1 250.

As FIG. 5 shows, each memory quadrant is partitioned into eight memory arrays 32 through 46. Two of the memory arrays 32 through 46 represent one output pin. Memory array 32 and array 34 may go to output pin 0, for example. Array 36 and array 38 may go to output pin 1, and so forth. Each memory array 32 through 46 includes an associated sense amplifier 132 through 148. FIG. 5 illustrates nine sense amplifiers 132 through 148 with only eight associated memory arrays 32 through 46. Which sense amplifier associates with a given memory array depends on whether the input data on row decoders 190 goes to the right or the left in a given sense amplifier. This information, however, cannot be known ahead of time. Accordingly, data may shift to the right, for example, in which case two bits come out of each to sense amplifier bank 134 through 148, two bits for each amplifier making a total of 16 bits per quadrant. In this example, LIAMPs 192 and 194 would not be used due to the row selected. In normal operation, since two arrays represent one I/O pin, it is only desired to have one bit out of the memory arrays. So, by shifting to the right, data from ARRAY 1 32 goes to the right, and data from ARRAY 2 34 goes to the right. This makes LIAMPS 196 and 198 associate with ARRAY 1 32 while LIAMPS 200 and 202 associate with ARRAY 2 34.

In the memory array quadrant of FIG. 5, LIAMPs 192 through 226 have two extra lines each to be used for the DFT mode. When in normal mode, the LIPs are all low, therefore the pull down devices are never on, and the common line will stay high. The DFT control lines control several DFT modes, in the x16 mode one LIAMP of every four is allowed to output data on the LIP lines, then four bits are compared in the quadrant. In the x64 mode, all four LIAMPs of every four are allowed to output data on the LIP lines, and 16 bits are compared in the memory quadrant. The MUX 2 blocks occur to handle the data shift from the memory array to the LIAMPs. The MUX 2 blocks occur in each memory quadrant nearest the center of the memory device.

FIG. 6 illustrates in more detail the I/O configuration for LIAMPS 192 and 194, for example. According to FIG. 6, line 164 provides five equalization pulses from equalization and DFT PRW signal generator 154 (see FIG. 4), one for each group of four LIAMPs plus the extra pair of LIAMPs on the end. LIAMP select lines 168 provide a total of 18 inputs from LIAMP select logic 156 (see FIG. 4) to select the four of 18 LIAMPs to read or write data. $\overline{WE}$ line 74 provides a write enable input from tester 20. DFT control lines 228 provide two control inputs to LIAMP 192. LIAMPs 192 and 194, in response to these inputs, provides a LIP signal on line 260 and on line 262 to MUX 1 230. Line pair 264 provides input from write multiplexers 70 and output to output multiplexers and inversion logic 86, or output buffer 94. LIAMP 194 receives inputs from lines 164, 168, 74, and 228 as described for LIAMP 192. Likewise, LIAMP 194 provides LIP signals to MUX 1 230 on lines 266 and 268, while communicating with write muxes and output muxes or output buffers via line 270.

FIG. 7 illustrates one possible configuration for MUX 1 230, as well as the other MUX 1 circuits 232 and 234 of FIG. 5. Based on outputs from LIAMPS 192 through 198, MUX 1 230 generates outputs 270 for a $T_0$ output and 272 for an $F_0$ output. For these outputs, line 260 provides a $T_1$ input and line 262 provides an $F_1$ input to OR gates 274 and 276, respectively. From LIAMP 194, line 266 provides a $T_2$ input and line 268 provides an $F_2$ input to OR gates 274 and 276, respectively. Similarly, LIAMP 196 provides on line 278 a $T_3$ input and on line 280 an $F_3$ input to OR gates 282 and 284, respectively. From LIAMP 198, line 286 provides a $T_4$ input and line 288 provides an $F_4$ input to OR gates 282 and 284, respectively. OR gate 290 receives the OR output from OR gates 274 and 282. OR gate 292 receives the OR'd output from OR gate 276 and 284. $T_0$ output 270, therefore, represents the OR output from OR gate 290, while $F_0$ output 272 flows from OR gate 292. $T_0$ represents the logical OR of $T_1, T_2, T_3$, and $T_4$. $F_0$ represents the logical OR of $F_1, F_2, F_3$, and $F_4$.

FIG. 8 shows a truth table that associates with MUX 1 230. For the truth table that FIG. 8 represents, there are 16 combinations for the x64 mode of the type that grouping A represents. For by x16 mode operations, there is two combinations of the type that grouping B depicts, but is placed on one of the four input pairs. For a single array, one of four LIAMPS will be active. The other three outputs are low on both outputs. The row of the truth table in FIG. 8 designated with the letter "C" represents the non-DFT mode of operation.

FIG. 9 illustrates a circuit for performing the function of MUX 2 236, as well as the other MUX 2 circuits appearing in FIG. 5. For example, from LIAMPS 216 and 218, MUX 2 236 receives amplified outputs. In particular, on line 300 appears $T_1$ input and on line 302 appears $F_1$ input that go to logical OR gates 304 and 306, respectively. From LIAMP 218 line 308 carries a $T_2$ signal and line 310 carries a $F_2$ signal that go, respectively, to logical OR gates 304 and 306. OR gate 304 produces on line 312 a $T_0$ output. OR gate 306 produces on line 314 an $F_0$ output.

FIG. 10 provides a truth table for the inputs and outputs associated with MUX 2 circuit 236. In the truth table of FIG. 10, one of the combinations designated by the "A" occurs for x64 DFT mode. In the x16 DFT mode of operation, one combination of the form designated by the letter "B" occurs. The values designated by the "C" associate with non-DFT operations, as well as for the right hand MUX 2 240 when its LIAMPS are not operating (i.e., due to there being nine sense amplifier locations).

The purpose of MUX 2 circuits, such as MUX 2 236, for example, is to combine two pairs of inputs into a single output pair for use by another MUX 2 circuit 246, for example, or a COMP 1 circuit 248, for example. The COMP 1 circuit 248 is used to discharge the quadrant specific common line if a failure occurs. The MUX 2 circuit 236 is unique in that no control signals are required. Each MUX 2 circuit uses only combinational logic and provides the proper output for x16, x32 and x64 DFT read operations.

In the non-DFT modes, all inputs to MUX 2 circuit 236 are low. This, in turn, produces only low outputs. As long as all inputs to the comparitor circuit (COMP 1 and/or COMP 2) are low (see FIGS. 16 and 17, below), the common line 258 will not discharge. In other words, a known state for the output of the comparitors exists. If the MUX 2 circuit 236 inputs are all low, and its output go into another MUX 2 circuit 236, the low state will simply be propagated from one MUX 2 236 to another.

In the DFT mode, the $T_x$ and $F_x$ inputs will either be complementary or both low. The MUX 2 circuit logically OR all of the true (T) inputs to create the true output. Likewise, all of the false (F) inputs are logically OR to create the false output. If all of the inputs are low, the outputs will also be low. If only some of the input pairs are low, they will not have any bearing on the outputs. The outputs will only be affected by the complementary pair of inputs.

When only one complementary pair of inputs exists (the other pair has both inputs low), the complementary inputs will simply be propagated to the output. If, on the other hand, both inputs are complementary pairs, the combinational logic will determine if both the $T_1$ and $T_2$ inputs are the same, and if both the $F_1$ and $F_2$ inputs are the same. If the true inputs match and the false inputs match, the outputs will be complementary and match the input state. When they do not match, both outputs will be high.

When both outputs are high, the data from the LIAMPs is not the same; therefore, this indicates a failure. Both outputs being high will also propagate as two high outputs in any succeeding MUX 2 circuits. Since the low input pairs and the failing high pairs propagate to the next stage (whether it is a comparitor which evaluates the data, or another MUX 2 circuit), the MUX 2 circuits can be combined to form multiple stages. This is evidenced from the left side of the array figure and in the MUX 1 circuit.

By taking any combination of inputs, whether it is an inactive low pair, a failing high pair, or combining complementary pairs, the MUX 2 circuit provides all the logic necessary for the x16, x32, and x64 tests with no control signal and a minimal amount of logic.

FIG. 11 illustrates a schematic block diagram of the various inputs and outputs for comparators COMP 1, 242 through 250 of FIG. 5. As FIG. 11 illustrates, line 270 and 272, respectively, provide from MUX 1 230 a $T_1$ input from line 270 and a $F_1$ input from line 272. Lines 316 and 318 from MUX 1 232, respectively, provide a $T_2$ and $F_2$ input to comparator circuit 245. Comparator circuit 245 provides a Z output on line 320 based on comparing the $T_1$, $F_1$, $T_2$, and $F_2$ inputs. The Z output on line 320 goes to pull-down device 322 which includes pull-down transistor 324 to provide an output to quadrant-specific common line 102 of FIG. 5. Pull-down device 322 of FIG. 11 provides an N-channel device in which, if the input to the gate is high, it turns on, therefore discharging the previously high potential charged quadrant specific common line.

FIG. 12 shows the comparator truth table for COMP 1 245 of FIG. 11. In FIG. 12, the truth values $T_1$, $F_1$, $T_2$, and $F_2$, when all equal to zero, yield a Z output value of zero which is the result of the LIAMPs outputting a zero on all LIPS when the DFT mode value equals zero. This represents the non-DFT mode, or equalization when the LIAMP is not sensing data in between read operations. The values associated with the rows designated "B" indicates a failed condition from COMP 1 circuit 242. Values within the "C" bracket represent a pass condition. Values within the "D" bracket indicate a fail condition. Values within the "E" bracket represent a pass condition. Furthermore, values within the "F" bracket represent a fail condition. These are the values for DFT mode, as the left-handed bracket that has the designation "DFT Mode=1" indicates. If the "DFT Mode=0" those values within the "A" bracket apply.

FIGS. 11 and 12 show that if the true or $T_x$ inputs have the same state and the false or $F_x$ inputs have the same but opposite state to the $T_x$ values, a pass condition exists. In the non-DFT mode, which is when all LIP inputs go low, a pass condition exists when the Z output equals 0. If a fail condition exists, this means that the common line 102 is discharged low through device 322. If a pass condition exists the common line 102 input is not pulled low, and the common line remains at its high potential.

FIGS. 13 through 15 illustrate the effects of constructing various alternative embodiments for comparator circuit 245. In FIG. 13 appears comparator circuit 245 including transistors 326 and 328 that, respectively, receive the inputs from line 270 and 316 for values $T_1$ and $T_2$. Transistor pair 330 and 332 associate with lines 272 and 318 to receive the respective inputs $F_1$ and $F_2$. Transistor pair 334 and 336 receive the $T_1$ input of line 270 and the $F_2$ input from line 318. Transistors 338 and 340 receive the $F_1$ input from line 272 and the $T_2$ input on line 316, respectively. Based on the values that transistors 326 through 340 receive, output goes to inverter 343 via line line 333. The extra inverter 345 and 346 and the NOR gate 342 are added to realize the comparator 247 shown in FIG. 16. The ZO output of this realization results in the truth table shown in FIG. 15. NOR gate 342 receives via inverter 346 DFT signal 348 to generate $Z_0$ output 320 to pull-down device transistor 386. If Z input 320 charges transistor 386, common line 102, is pulled low.

FIG. 14 shows an alternative embodiment of the circuit appearing in FIG. 13 to achieve outputs similar to those for comparator 245. In FIG. 14, alternative embodiment comparator circuit 350 receives $T_1$ input from line 270 and $T_2$ input on line 316 goes to AND gate 352 and NOR gate 354, respectively. Output from AND gate 352 goes to NAND gate 356. Output from NOR gate 354 goes to NAND gate 358 and NAND gate 360. $F_1$ input from line 272 and $F_2$ input from line 318 go, respectively, to AND gate 362 and NOR gate 364. AND gate 362 output goes to NAND gate 358, while NOR gate 364 output goes to NAND gate 356 and NAND gate 360. Outputs from NAND gate 356, NAND gate 358, and NAND gate 360 go to AND gate 366, which produces on line 321 the $Z_m$ output from alternative comparator circuit 350.

FIG. 15 provides a truth table for comparing the Z outputs of the comparator circuits appearing in FIGS. 13 and 14. The original design of the present invention includes the circuitry assimilating the components that FIG. 13 describes. The preferred embodiment may use, however, the alternative logic construction of FIG. 14. An attractive feature of alternative embodiment comparator circuit 350 is that it provides a complete truth table compared to the ideal truth table in FIG. 12. FIG. 15 shows that for the important pass conditions to occur for the values of $T_x$ and $F_x$, the outputs are equivalent between comparator circuit 245 of FIG. 13 and comparator circuit 350 of FIG. 14.

FIG. 16 shows the COMP 2 circuit 370 for comparing the quadrant-specific output of a quadrant with the results of the MUX 2 circuit 252 of FIG. 5 from a different quadrant MUX 2 circuit. COMP 2 circuit 370, like COMP 1 circuit 245, receives $T_1$ input on line 372, $F_1$ input on line 374, $T_2$ input on line 376, and $F_2$ input on line 378. One set of $T_x$ and $F_x$ lines come from one quadrant and the other set from a different quadrant as shown in lines 254 and 256 in FIG. 5. Comparator circuitry 247 within COMP 2 370 performs the comparison according to the value from DFT signal input 348. $Z_G$ output 384 from comparator circuitry 247 goes to transistor 386 to discharge one of the common lines from one of the four quadrants of the memory device. DFT signal input 348 controls whether x16 or x64 testing occurs. A x16 test compares four bits per quadrant. A x64 test compares sixteen bits per quadrant. The x32 test also tests sixteen bits per quadrant but only uses two quadrant specific common lines to determine the outcome of the test. Thus, if the DFT mode is low on signal 348, then the output 384 is low irrespective of the inputs. DFT low causes $Z_G$ output 384 to turn off pull-down device 386, thus preventing the common lines to which the comparitor is associated from falling to ground potential. If DFT is high, the truth table in FIG. 12 can be used.

FIG. 17 illustrates a configuration that the present embodiment uses to combine the results of the four memory array quadrants such as that quadrant described in FIG. 5. Accordingly, comparator logic 370 receives inputs 372 through 378 as well as DFT signal 348 to effect along with QUAD 1, common-line left top (CLLT) output on line 102, which connects between memory array quadrant QUAD 1 392 and QUAD 3 404. Memory array quadrant QUAD 1 392, as well as QUAD 2, QUAD 3, and QUAD 4 of FIG. 17, basically include the circuitry described in the block diagram of FIG. 5. Memory quadrant QUAD 2 395 provides output on lines 396 and 398 that go to COMP 2 400 and COMP 2 402, both of which receive DFT signals 348. COMP 2 400 provides output 404 to CLLT line 102 that goes to global comparator circuit 394. COMP 2 400 compares between the left two quadrants QUAD 1 and QUAD 2. COMP 2 402 provides output 406 that goes to common-line left bottom (CLLB) line 408, which also connects between QUAD 2 395 and global comparator circuit 395. QUAD 3 404 provides inputs 376 and 378 to COMP 2 and provides a common-line right top (CLRT) input to global comparator circuit 394. COMP 2 402 compares between the bottom two quadrants QUAD 2 and QUAD 4. The three COMP 2 circuits provide a means to compare the data between all four quadrants if all are used for the comparison at the same time. QUAD 4 412 provides outputs 414 and 416 to COMP 2 402, as well as a single output right bottom (CLRB) input to global comparator circuit 394. Global comparator circuit 394 provides a common Y output 418 to the output mux and inversion logic input 102 in place of the CLLT input for a 4 quadrant comparison for the memory device 21. In the quadrant comparator circuit of FIG. 17, DFT signal Q 348 controls the operation of each COMP 2 370, 400, and 402. Thus, if output from a comparison of QUAD 2 395 and QUAD 4 412 is desired, the DFT signal Q 348 to COMP 2 402 is turned on while DFT signal to COMP 2 380 and COMP 2 400 are turned off.

The DFT signal Q is used to disable the COMP 2 comparitors. If Q is low, the COMP 2 circuits cannot discharge the common line to which they are associated. If Q is high, the pull-down signal behaves like COMP 1. The common line cannot be pulled low if Q is low. The DFT signal Q is provided to extend the operation of the parallel read/write cycle by separating the comparison between the four QUADs. Failure information about a particular quadrant is contained on the quadrant-specific common line which is only affected by its corresponding quadrant. Global comparitor 394 can be disabled or removed to allow each of the quadrant-specific common lines to control the function of the output of to the output multiplexer. Furthermore, three additional multiplexers are used so that information about a specific quadrant is seen at the output. Four different outputs with a corresponding multiplexer connect to each of the four different common lines. The DQ input into the mux should be from one of the several DQ's from the quad whose data is being tested.

FIG. 18 illustrates a logical circuit diagram depicting the operations occurring within global comparator 394. From CLRT line 411, CLLT line 102, CLLB line 408 and CLRB line 413 signals go to AND gate 420 to generate Y output 418. The truth table of FIG. 19 illustrates the logical result of ANDing the input CLRT, CLLT, CLLB, and CLRB to generate the Y output. In essence, global comparator 394 operates as a true AND gate. If all common lines into AND gate 420 are high, the output for AND gate 420 goes high, otherwise, all outputs from AND gate 420 are low.

FIG. 20 illustrates the operation of the pull-up circuits of the present invention for generating the first high potential on the CLLT, CLRT, CLLB, and CLRB signals. In the DFT mode, pulse generator 430 receives a signal from LIAMP equalization circuits in the column logic such as output 166 from equalization and DFT PRW signal generator circuit 154 (FIG. 4) to generate a low pulse on line 432 to pull-up circuits 434, 436, 438, and 440. The pull-up circuits 434 through 440 pull up each of the four common lines 102, 408, 411, and 413 to establish a first potential state. In the non-DFT mode, pull-up circuits 434 through 440 pull the common lines 102, 408, 411 and 413 high at all times.

FIGS. 21 through 22 illustrate the circuitry for implementing output mux and inversion logic 86 that goes to output buffer 108 together with the truth table values that associate with these circuits. In FIG. 21, DFT mode input 104 and the inversion, via inverter 450 of CL input 102 goes to NAND gate 452. NAND gate 452 provides output to inverter 454 and to the gates of transistors 456 and 458. Output from inverter 454 goes to the gates of transistors 460 and 462. Transistors 456 and 460 form a switch that controls the flow of the inverted ED signal from inverter 464. Transistors 458 and 462 form a switch that controls the flow of array output on differential lines 80 and 82 (See FIG. 1). Depending on whether the array output on differential lines 80 and 82 or the expected data from line 69 passes through the associated transistor switches, output goes to output buffer 108. FIG. 22 illustrates the truth table associated with output mux and inversion logic circuit 86.

With reference to FIGS. 1, 21 and 22, when the DFT MODE is enabled and CL high, the state of the expected data 69 is disabled from affecting the output of the output multiplexer 86. Therefore, the truth table of FIG. 22 shows a DON'T CARE or X condition for the input from the expected data on the lead 69. While the DFT MODE is enabled, the state of common line 102 determines the output state of multiplexer 86 with respect to the state of the expected data on the common data-in lead 69. For instance when the common line 102 is at the high potential level because the read out data from all arrays matches each other, the output state of the multiplexer 86 on lead 114 agrees with the array data on differential lines 80 and 82. If this data, when it reaches the tester 20 through output buffer 108 is the same as the expected data, then the test passed. If it is different from the expected data, even though all the internal data is the same, the test failed. Alternatively, when common line 102 is at a low potential level because the read out data from one or more arrays does not match the expected data bit, the output state of the multiplexer 86 on the lead 114 is an inversion of the expected data bit on the common data-in lead 69 and the state of the data bit on lead 116 matches the data bit on the lead 69.

The output signal of the multiplexer 86 on the leads 114 and 116 is latched into an output buffer 108. Lines 114 and 116 are a differential pair either consistent with the differential lines 80 and 82, or the creation of a differential pair based on the inversion of the expected data as described above. This output signal, stored in output buffer 108, is output over output lead 48 to the input/output terminal of tester 20.

During the DFT MODE, the data signal sent to tester 20 either matches the expected data bit when all of the read out test bits from the arrays 32–46 match the expected data bit or is an inversion of the expected data bit when one or more of the read out test bits do not match the expected data bit.

This information, sent to tester 20 from the memory device 21 together with information similarly sent from the other memory devices, is analyzed for detected faults in memory devices 21–28. Results of the analysis are stored in the tester 20 for subsequent passing of good devices for commercial use, repairing of some devices before commercial use, or rejecting some devices to prevent their commercial use.

Figure 23:
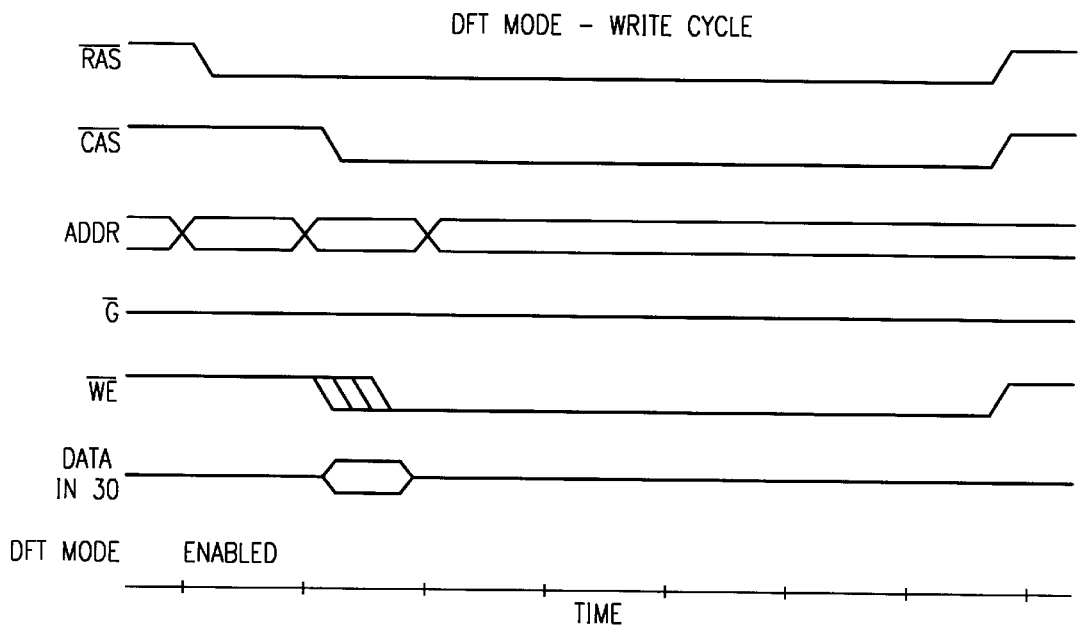
FIGS. 23 through 26 illustrate timing diagrams for circuitry operations according to the present embodiment.
Figure 24:
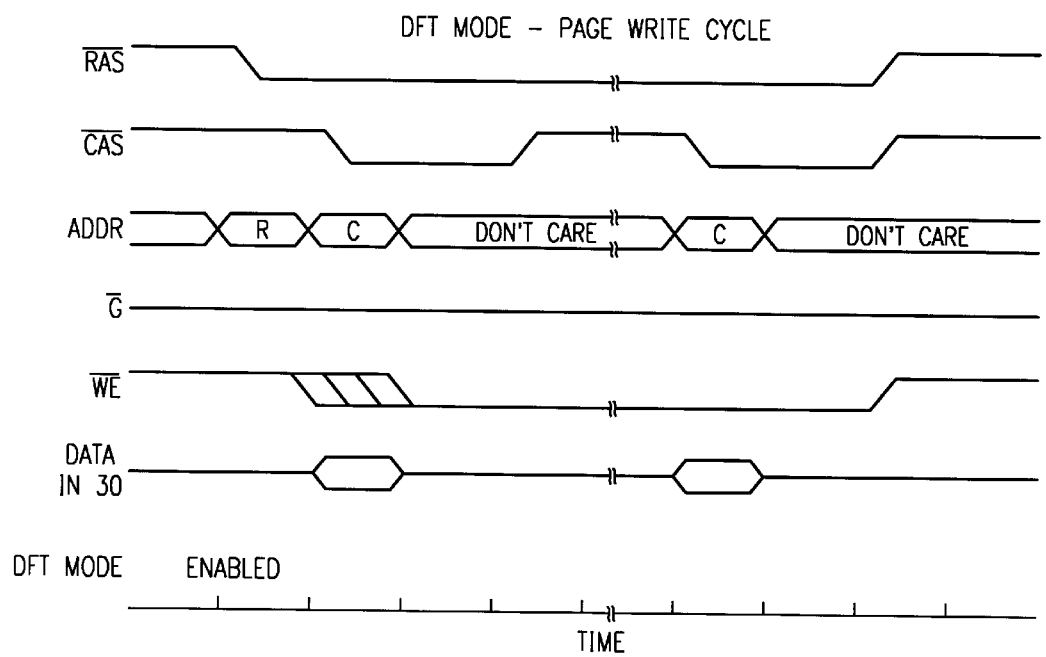
Figure 25:
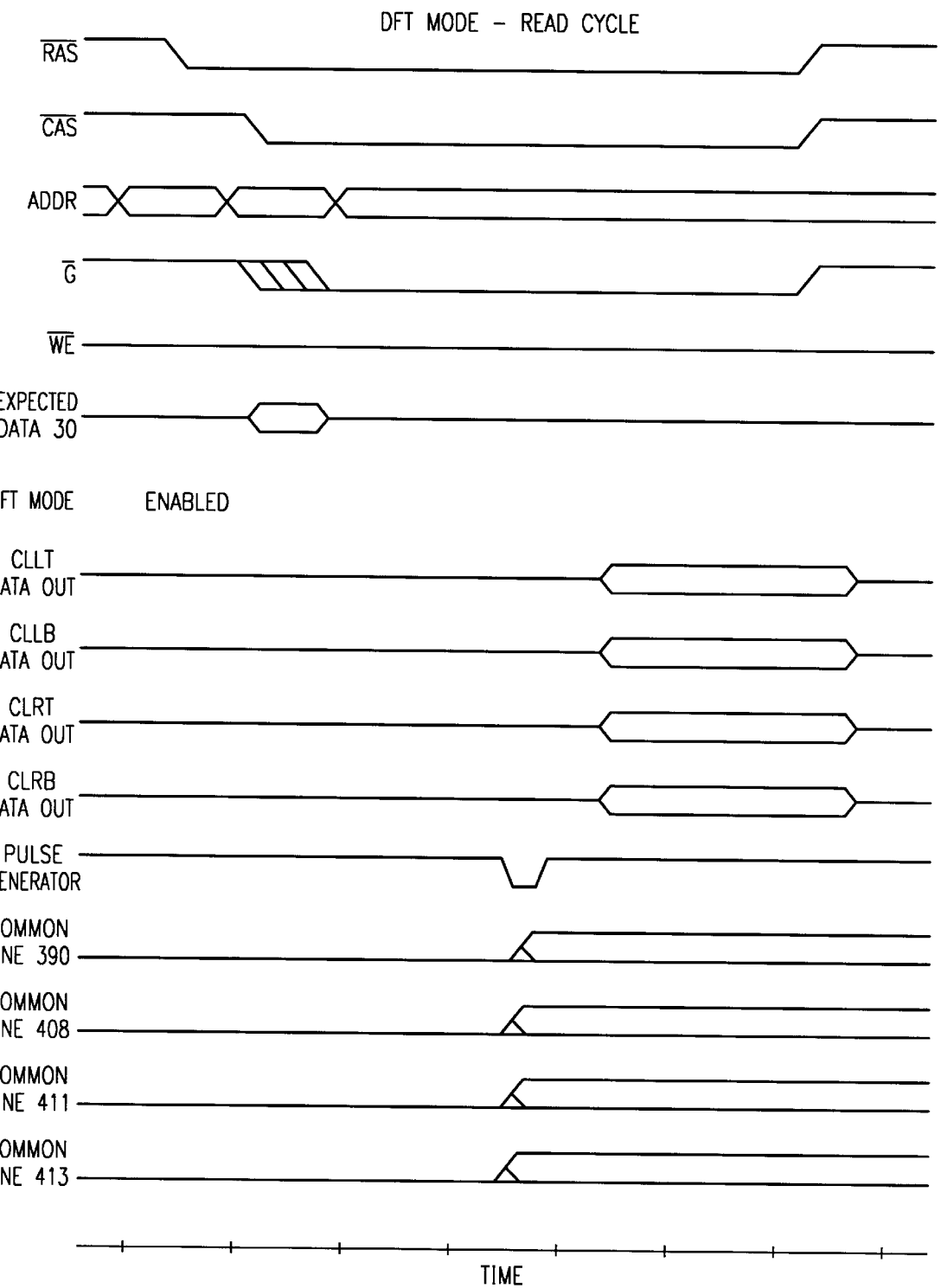
Figure 26:
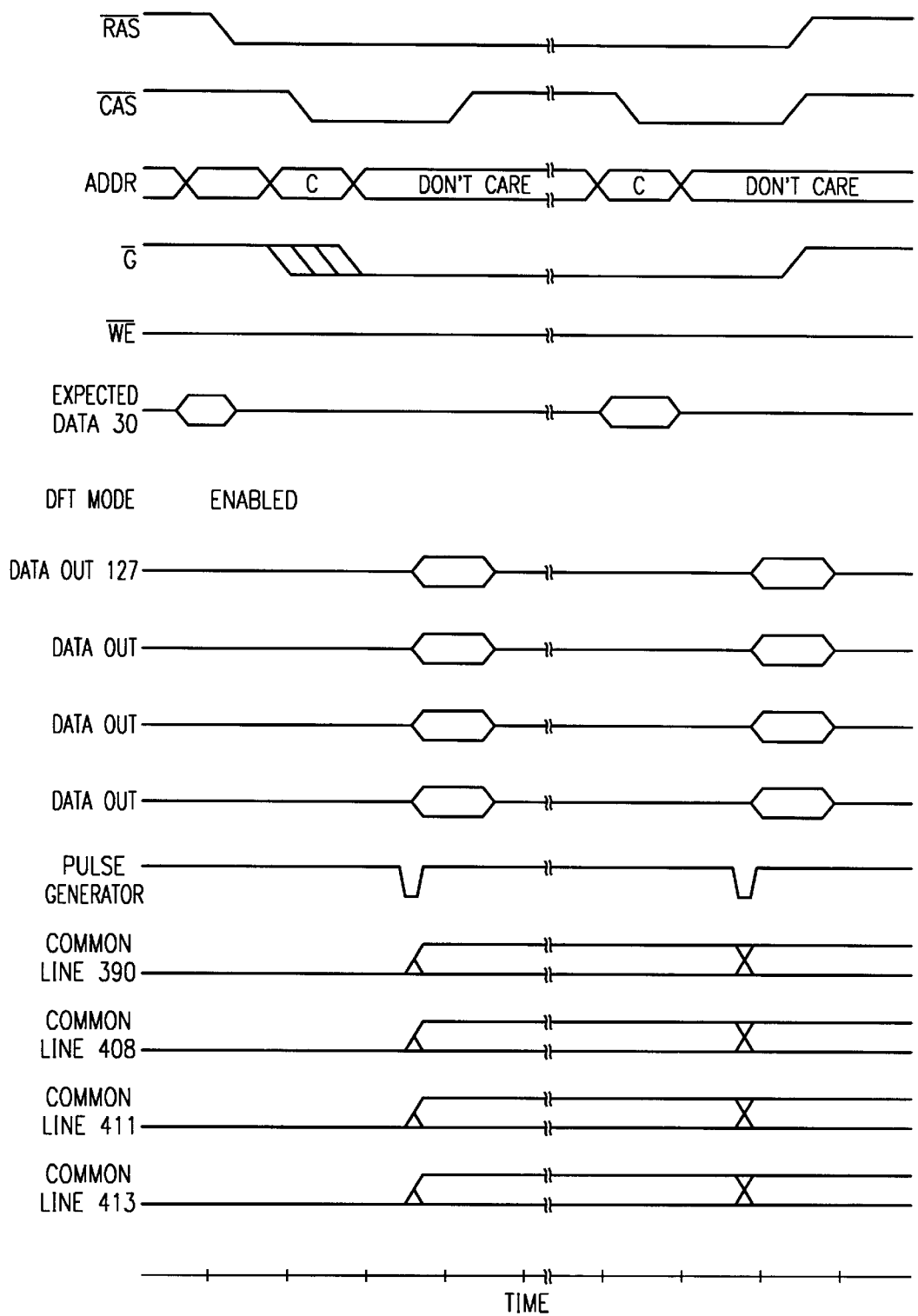

FIGS. 23 through 26 illustrate timing diagrams associated with the circuit of the present invention. Note that in FIGS. 23 and 24, a single DFT mode write cycle and DFT mode page write cycle provide a data in timing diagram. Within the memory device of the present invention, four data out signals may be provided according to the memory array QUAD 1 through QUAD 4 and common line outputs associated with common lines CLLT, CLRT, CLLB and CLRB. FIGS. 25 and 26, therefore, show the four data output lines.

In FIG. 23, the row access strobe signal 122 from tester 20 goes active low and latches an address into row address buffer 120. The column access strobe signal 128 goes active low and latches a column address into a column address buffer 150. The write enable signal 76 also goes low signifying a write cycle. The latter of the column access strobe signal going low or the write enable signal going low is used for producing a signal to latch a test data signal DATA IN from the tester 20 into an input data latch 66 in FIG. 2. An output enable signal is used for turning on output buffers 94–108 in FIG. 1. The output enable signal is inactive high for write cycles.

FIG. 24 shows a timing diagram for a DFT page write operation. As shown, the row address is latched into the memory device in response to the row address strobe signal going low. A first column address is latched into the memory device in response to the column address strobe signal going low a first time. The write enable signal is low to signify a write operation. Data, valid at the time that the column address strobe signal goes low, is latched into the memory device and is stored in the arrays at the first addressed storage cell.

When the column address strobe goes low a second time, valid data is latched into the memory device and is stored in the arrays at a second addressed storage cell. This second addressed storage cell is in the same row as the first addressed storage cell but may be in any column addressed by the second column address. In this page write operation, the tester writes data into plural storage cells of a single row of the arrays by only selecting the row address one time.

FIG. 25 describes component timing during a test readout operation. To commence the test readout operation, the signal DFT MODE is enabled and the write enable signal is inactive high. Row and column addresses are latched into the respective row and column address buffers, in response to the row address strobe signal and the column address strobe signal. An expected data bit, similar in state to the test data bit, is applied from the tester 20 through the lead 30 to the input data latch 66 and is latched on the falling edge of the column address strobe signal. From the input data latch 66, the expected data bit is amplified by the amplifier 68 and is fanned out by way of the common data-in lead 69 and short parallel branches to the write multiplexers 70 and to the output multiplexer and inversion logic 86. The write multiplexers are not active in the read (comparison) cycle. The output enable signal goes active low around the time that the column address strobe signal goes low to enable the output buffers 94–108.

A high state of the write enable signal disables the write multiplexers 70 through 72 and the sense amplifiers 132–146 from receiving the expected data bit from the write multiplexers 70 through 72. When the column address strobe signal falls to its low level, the test data bit stored in each of memory arrays 32–46 is read out to the respective sense amplifiers 132–146. Although a common test data bit was written into each of the arrays 32–46 and the other three quadrants not shown in FIG. 2, because of flaws or defects left during fabrication of the device, all of the arrays may not actually store the same bit state. If one or more of the stored bits is in a different state in the commonly addressed bit locations of the different arrays 32–46, there is a fabrication or logic fault which is to be detected as a result of the test readout operation. Whatever the state of the bit read from each array, the associated sense amplifier detects the state and transmits it to the LIP lines to go to the associated distributed mux and comparison circuits shown in FIG. 5.

Each of sense amplifiers 132–146 has two output lines, such as output lines 81 and 93 to 80 and 82 that connect to sense amplifier 132. Similarly, sense amplifier 132 through 148 have two output LIP lines for the parallel comparison. Both output lines are at a low potential at the beginning of the read cycle. If the state of the accessed storage cell is high, the output line $T_x$ goes high and the output line $F_x$ remains low. If the state of the accessed storage cell is low, the output line $T_x$ stays low and the output line $F_x$ goes high. In a read cycle, one of the four LIP line pairs may output data, or all four LIP line pairs may output data, depending on the test mode.

The column logic equalization and DFT PRW signal generator 154 determines the state of the low pulse generator 430. That output of the equalization and PRW DFT signal generator 154 is applied to the low pulse generator 430, which produces a brief low output pulse, as shown in FIG. 25. The pulse from the pulse generator 430 briefly enables the four pull up circuits 434 through 440, which may be a transistor switch, to conduct. A potential $V_{cc}$ is applied through pull-up circuits 434 through 440 to the common lines CLLT, CLRT, CLLB, and CLRB. The common lines CLLT, CLRT, CLLB, and CLRB are charged to the potential $V_{cc}$ and is held at that potential if all of the pull down circuits are off. The common line or common lines will be discharged if one or more of the read data is of an opposite state to its adjacent read data.

FIG. 26 provides a timing diagram for a DFT page read operation. In this operation, a row address is latched into the device when the row address strobe signal goes low. A first column address is latched into the device when the column address strobe signal goes low. Also when the column address strobe signal goes low, it reads data from the addressed storage location of the arrays. Testing is accomplished with respect to an expected data bit as described hereinbefore. Advantageously for the page read operation, the next data bit can be read out as soon as another column address is latched onto the memory device. Another low pulse is generated to establish again a first high potential state on the common lines. All of the data bits for the originally accessed row still reside in the sense amplifiers so only a new column address is needed. In a similar manner, a plurality of data bits can be read out sequentially from the same row of the arrays very quickly and tested by the comparison circuits.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed below.

What is claimed is:

1. An integrated circuit memory device comprising:
a plurality of input/output pins;
plural arrays of addressable storage cells formed into a set of quadrants;
a writing circuit for providing through a common data-in lead plural copies of a test data bit, applied through one of the pins, for storage in an addressed storage cell in each of the arrays of storage cells;
a circuit for receiving an expected data bit;
a readout circuit for reading out the stored test data bit from the addressed storage cell in each of the arrays of storage cells;
a common line circuit, comprising a plurality of quadrant-specific common lines, said quadrant-specific common lines for specifically addressing quadrants within said set of quadrants, said common line circuit responsive to a column address change, for establishing a first potential state on said quadrant-specific common lines; and
a plurality of multiplexer circuits, each multiplexer associated with two different arrays of storage cells, arranged to combine the multiple data bits from the associated arrays to a reduced number of outputs to the plural comparitors;
a plurality of comparitors, each comparitor associated with said plurality of multiplexer circuit, and arranged for responding to a plurality of test data bits from said plural arrays of addressable storage cells for changing said first potential state on said associated quadrant-specific common line when any comparison fails; and
a transmission circuit for transmitting the potential state of either the inverse of the expected data or the potential state of the read-out data from the addressed storage cells, based upon the potential state of all four of the common lines.

2. An integrated circuit memory device, in accordance with claim 1, wherein said plurality of comparitor circuits is distributed around the memory device, each comparitor circuit being located in close proximity to associated ones of said plurality of multiplexer circuits, said plurality of multiplexer circuits formed in close proximity to their associated arrays of storage cells.

3. An integrated circuit memory device, in accordance with claim 2, wherein said potential state of the quadrant-specific common line represents a result of all of the quadrant specific comparison operations between said test data bits read out of the addressed storage cell in each of the arrays of storage cells in the specific quadrant.

4. An integrated circuit memory device, in accordance with claim 3, wherein each of said quadrant-specific common lines is connected with an output of each of the comparison circuits in the specific quadrant.

5. An integrated circuit memory device, in accordance with claim 4, wherein said plurality of input/output pins comprises a plurality of separate pins for carrying input data bits; and a plurality of separate pins for carrying output data bits.

6. An integrated circuit memory device, in accordance with claim 4, wherein said plurality of input/output pins are a plurality of pins, each pin carrying both input and output data bits.

7. An integrated circuit memory device, in accordance with claim 1, wherein said potential state of the quadrant-specific common line represents a result of all of the quadrant specific comparison operations between the test data bits read out of the addressed storage cell in each of the arrays of storage cells in the specific quadrant.

8. An integrated circuit memory device, in accordance with claim 7, wherein said plurality of input/output pins comprises a plurality of separate input pins and a plurality of separate output pins.

9. An integrated circuit memory device, in accordance with claim 7, wherein the input/output pins are a plurality of pins, each pin carrying both input and output data bits.

10. An integrated circuit memory device, in accordance with claim 7, wherein the potential state of each of the quadrant specific common lines is represented at a different output pin from the device.

11. An integrated circuit memory device, in accordance with claim 7, wherein the combination of the potential state of the quadrant specific common lines is represented at a single output pin from the device.

12. An integrated circuit memory device, in accordance with claim 1, wherein said common data-in lead, the four quadrant specific common lines, and any small number of control lines for the numerous test modes are the only design for test leads routed across the device to all of the arrays of storage cells.

13. An integrated circuit memory device comprising:
a plurality of input/output pins;
plural arrays of addressable storage cells;
a page mode writing circuit for providing through a common data-in lead plural copies of a test data bit, applied through one of the pins, for storage in addressed storage cells along a row in each of the arrays of storage cells;
a circuit for receiving an expected data bit;
a readout circuit for reading out the stored test data bit from the addressed storage cells along the row in each of the arrays of storage cells;
a common line circuit, responsive to a column address change, for establishing a first potential state on all four quadrant-specific common lines;
a plurality of multiplexer circuits, each multiplexer circuit associated with two different arrays of storage cells and arranged to combine the multiple data bits from the associated arrays to a reduced number of outputs to the plural comparitors circuits;
a plurality of comparitor circuits, each comparitor circuit associated with multiple multiplexers and arranged for responding to the test data bits read out from storage in the associated arrays, for changing the potential state on the associated quadrant specific common line when any comparison fails; and
a circuit for transmitting the potential state of either the inverse of the expected data or the potential state of the read-out data from the addressed storage cells, based on the potential state of all four of the common lines.

14. An method for testing an integrated circuit memory device, said integrated circuit memory device comprising design-for-test circuitry, the method comprising the steps of:
a plurality of input/output pins;
plural arrays of;
a writing circuit for providing through a common data-in lead plural copies of a test data bit to a plurality of input/output pins that address plural arrays of addressable storage cells formed into a set of quadrants;
receiving an expected data bit and reading out the stored test data bit from the addressed storage cell in each of the arrays of storage cells;
specifically addressing quadrants within said set of quadrants using a common line circuit within a plurality of quadrant-specific common lines, said quadrant-specific common lines responsive to a column address change for establishing a first potential state on said quadrant-specific common lines;
combining the multiple data bits from the associated arrays to a reduced number of outputs to the plural comparitors using a plurality of multiplexer circuits;
responding to a plurality of test data bits from said plural arrays of addressable storage cells for changing said first potential state on said associated quadrant-specific common line when any comparison fails a plurality of comparitors; and
transmitting the potential state of either the inverse of the expected data or the potential state of the read-out data from the addressed storage cells, based upon the potential state of all four of the common lines.

15. The method of claim 14, wherein said plurality of comparitor circuits is distributed around the memory device, each comparitor circuit being located in close proximity to associated ones of said plurality of multiplexer circuits, said plurality of multiplexer circuits formed in close proximity to their associated arrays of storage cells.

16. The method of claim 14, wherein said potential state of the quadrant-specific common line represents a result of all of the quadrant specific comparison operations between said test data bits read out of the addressed storage cell in each of the arrays of storage cells in the specific quadrant.

17. The method of claim 14, wherein each of said quadrant-specific common lines is connected with an output of each of the comparison circuits in the specific quadrant.

18. The method of claim 14, further comprising the steps of for carrying input data bits on a first set of pins and carrying output data bits on a second plurality of separate pins.

19. The method of claim 14, further comprising the step of carrying both input and output data bits on a single set of pins.

20. The method of claim 14, further comprising the step of using said potential state of the quadrant-specific common line to represent the result of all of the quadrant specific comparison operations between the test data bits read out of the addressed storage cell in each of the arrays of storage cells in the specific quadrant.

21. The method of claim 14, further comprising the step of representing the potential state of each of the quadrant specific common lines using a set of distinctly different output pins from the device.

22. An integrated circuit memory device comprising:
a plurality of input/output pins;
plural arrays of addressable storage cells formed into a set of quadrants;
a writing circuit for providing through a common data-in lead plural copies of a test data bit, applied through one of the pins, for storage in an addressed storage cell in each of the arrays of storage cells;
a circuit for receiving an expected data bit;
a readout circuit for reading out the stored test data bit from the addressed storage cell in each of the arrays of storage cells;
a common line circuit, comprising a plurality of quadrant-specific common lines, said quadrant-specific common lines for specifically addressing quadrants within said set of quadrants, said common line circuit responsive to a column address change, for establishing a first potential state on said quadrant-specific common lines;
a plurality of multiplexer circuits each multiplexer associated with two different arrays of storage cells, arranged to combine the multiple data bits from the associated arrays to a reduced number of outputs to the plural comparitors;

a plurality of comparitors, each comparitor associated with said plurality of multiplexer circuit, and arranged for responding to a plurality of test data bits from said plural arrays of addressable storage cells for changing said first potential state on said associated quadrant-specific common line when any comparison fails; and a transmission circuit for transmitting the potential state of either the inverse of the expected data or the potential state of the addressed storage cells, based upon the potential state of one or more of the four common lines.

23. An integrated circuit memory devices in accordance with claim 22, wherein said plurality of comparitor circuits is distributed around the memory device, each comparitor circuit being located in close proximity to associated ones of said plurality of multiplexer circuits, said plurality of multiplexer circuits formed in close proximity to their associated arrays of storage cells.

24. An integrated circuit memory device in accordance with claim 23, wherein said potential state of the quadrant-specific common line represents a result of all of the quadrant specific comparison operations between said test data bits read out of the addressed storage cell in each of the arrays of storage cells in the specific quadrant.

25. An integrated circuit memory device, in accordance with claim 24, wherein each of said quadrant-specific common lines is connected with an output of each of the comparison circuits in the specific quadrant.

26. An integrated circuit memory device, in accordance with claim 25, wherein said plurality of input/output pins comprises a plurality of separate pins for carrying input data bits; and a plurality of separate pins for carrying output data bits.

27. An integrated circuit memory device, in accordance with claim 25, wherein said plurality of input/output pins are a plurality of pins, each pin carrying both input and output data bits.

28. An integrated circuit memory device, in accordance with claim 22, wherein said potential state of the quadrant-specific common line represents a result of all of the quadrant specific comparison operations between the test data bits read out of the addressed storage cell in each of the arrays of storage cells in the specific quadrant.

29. An integrated circuit memory device in accordance with claim 28, wherein said plurality of input/output pins comprises a plurality of separate input pins and a plurality of separate output pins.

30. An integrated circuit memory device, in accordance with claim 28, wherein the input/output pins are a plurality of pins, each pin carrying both input and output data bits.

31. An integrated circuit memory device, in accordance with claim 28, wherein the potential state of one or more of the quadrant specific common lines is represented at a different output pin from the device.

32. An integrated circuit memory device in accordance with claim 28, wherein the combination of one or more of the potential state of the quadrant specific common lines is represented at a single output pin from the device.

33. An integrated circuit memory devices in accordance with claim 22, wherein said common data-in lead, the four quadrant specific common lines, and any small number of control lines for the numerous test modes are the only design for test leads routed across the device to all of the arrays of storage cells.

* * * * *